(12) United States Patent
Shapiro et al.

(10) Patent No.: US 10,200,026 B1
(45) Date of Patent: Feb. 5, 2019

(54) HIGH POWER HANDLING SWITCH USING REDUCED OPERATING IMPEDANCE

(71) Applicant: pSemi Corporation, San Diego, CA (US)

(72) Inventors: Eric S. Shapiro, San Diego, CA (US); David Ronald Kirkbride, Chippenham (GB)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/669,721

(22) Filed: Aug. 4, 2017

(51) Int. Cl.
| | |
|---|---|
| H03K 17/16 | (2006.01) |
| H04B 1/44 | (2006.01) |
| H03H 11/28 | (2006.01) |
| H01P 1/38 | (2006.01) |

(52) U.S. Cl.
CPC ............. *H03K 17/161* (2013.01); *H01P 1/38* (2013.01); *H03H 11/28* (2013.01); *H04B 1/44* (2013.01)

(58) Field of Classification Search
CPC ........... H03K 17/161; H01P 1/38; H04B 1/44; H03H 11/28

USPC .......................................................... 455/78
See application file for complete search history.

(56) References Cited

U.S. PATENT DOCUMENTS

| | | | | |
|---|---|---|---|---|
| 2006/0252394 | A1* | 11/2006 | Suwa | H04B 1/48 455/201 |
| 2010/0308906 | A1* | 12/2010 | Draxelmayr | G05F 3/262 327/581 |
| 2016/0233919 | A1* | 8/2016 | Rafi | H03F 3/19 |

OTHER PUBLICATIONS

Todorow, Valentin "Impedance Matching and Matching Networks", Applied Materials, Etch Products Business Group, 2009, 27 pgs.

* cited by examiner

*Primary Examiner* — Eugene Yun
(74) *Attorney, Agent, or Firm* — Jaquez Land Greenhaus LLP; Martin J. Jaquez, Esq.; Bruce Greenhaus, Esq.

(57) ABSTRACT

An architecture that increases the power that handling capability of the switches within a transceiver is disclosed. An impedance transformation network is introduced at each of the terminals of a transmit/receive switch. Each impedance transformation network transforms the impedance external to the transmit/receive switch to a lower impedance internal to the switch to increase the power handling capability of the transmit/receive switch.

10 Claims, 14 Drawing Sheets

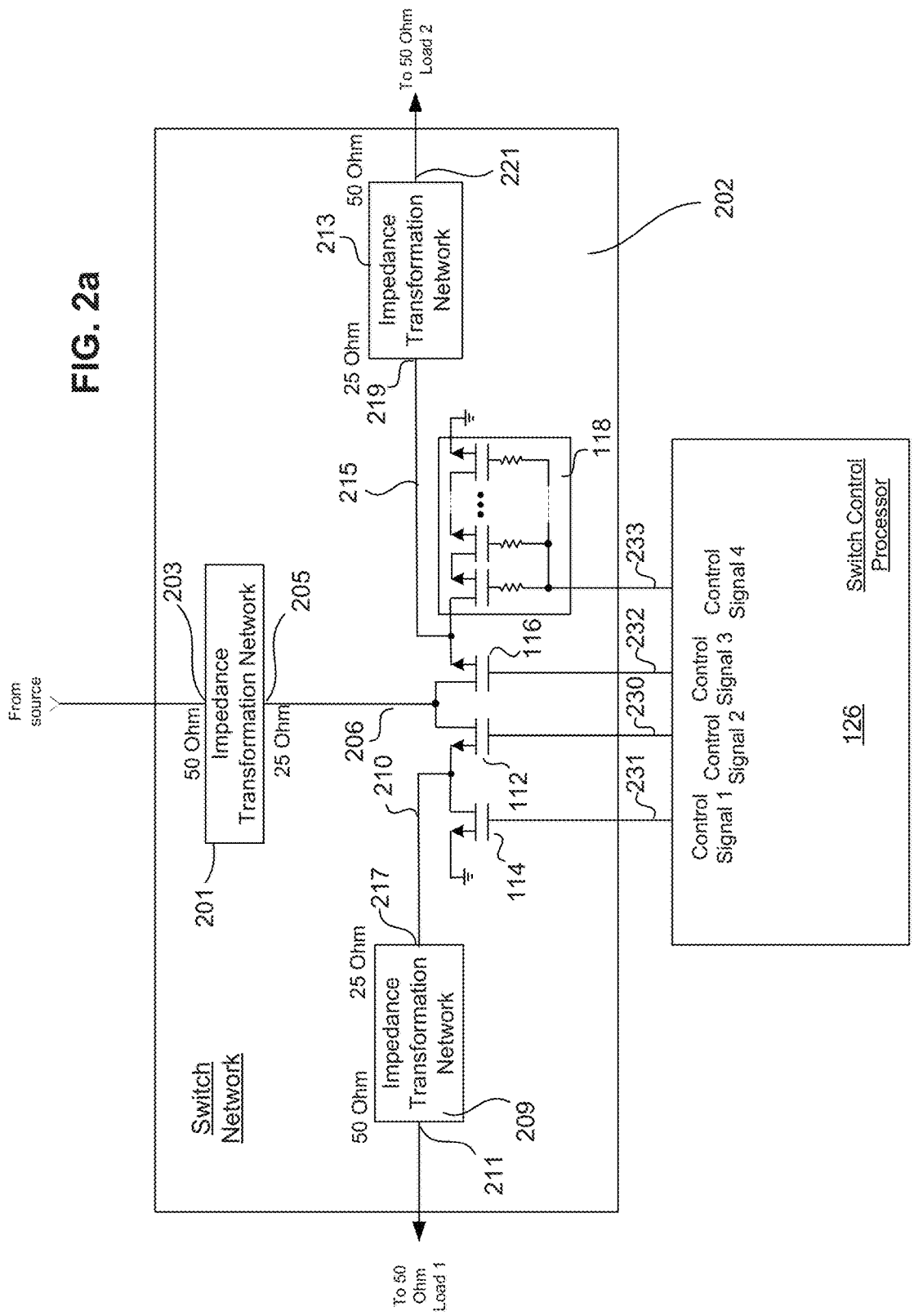

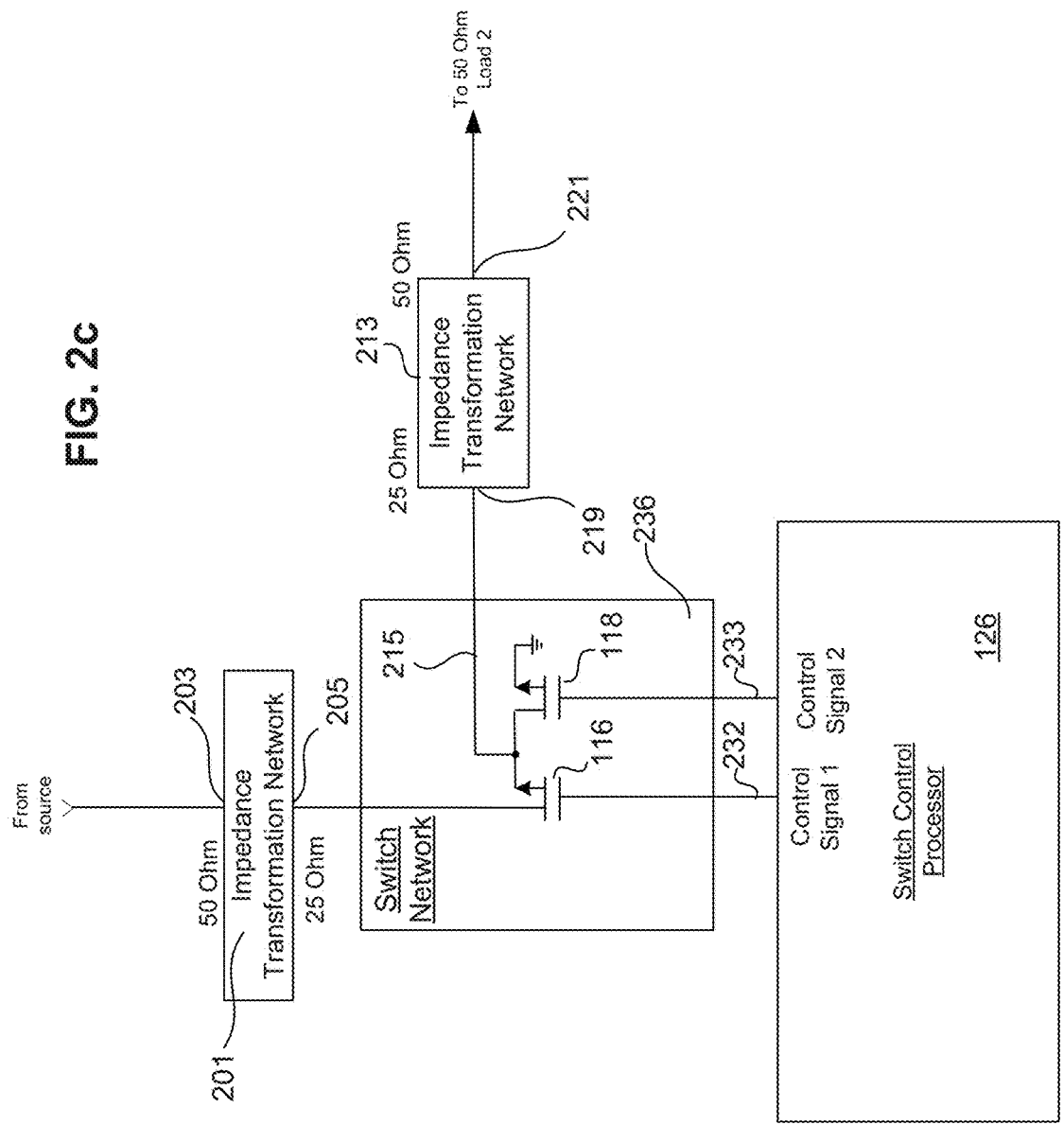

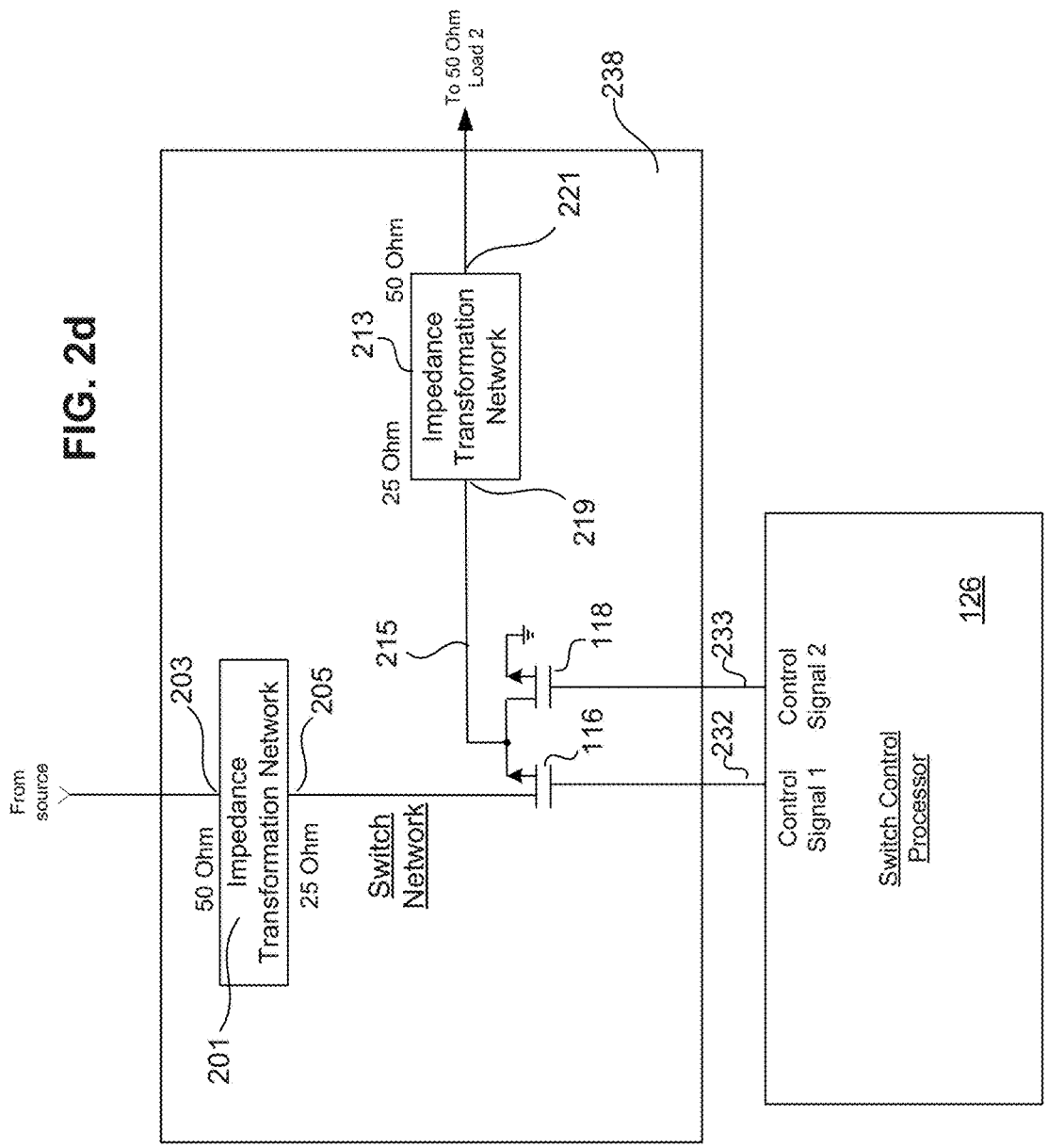

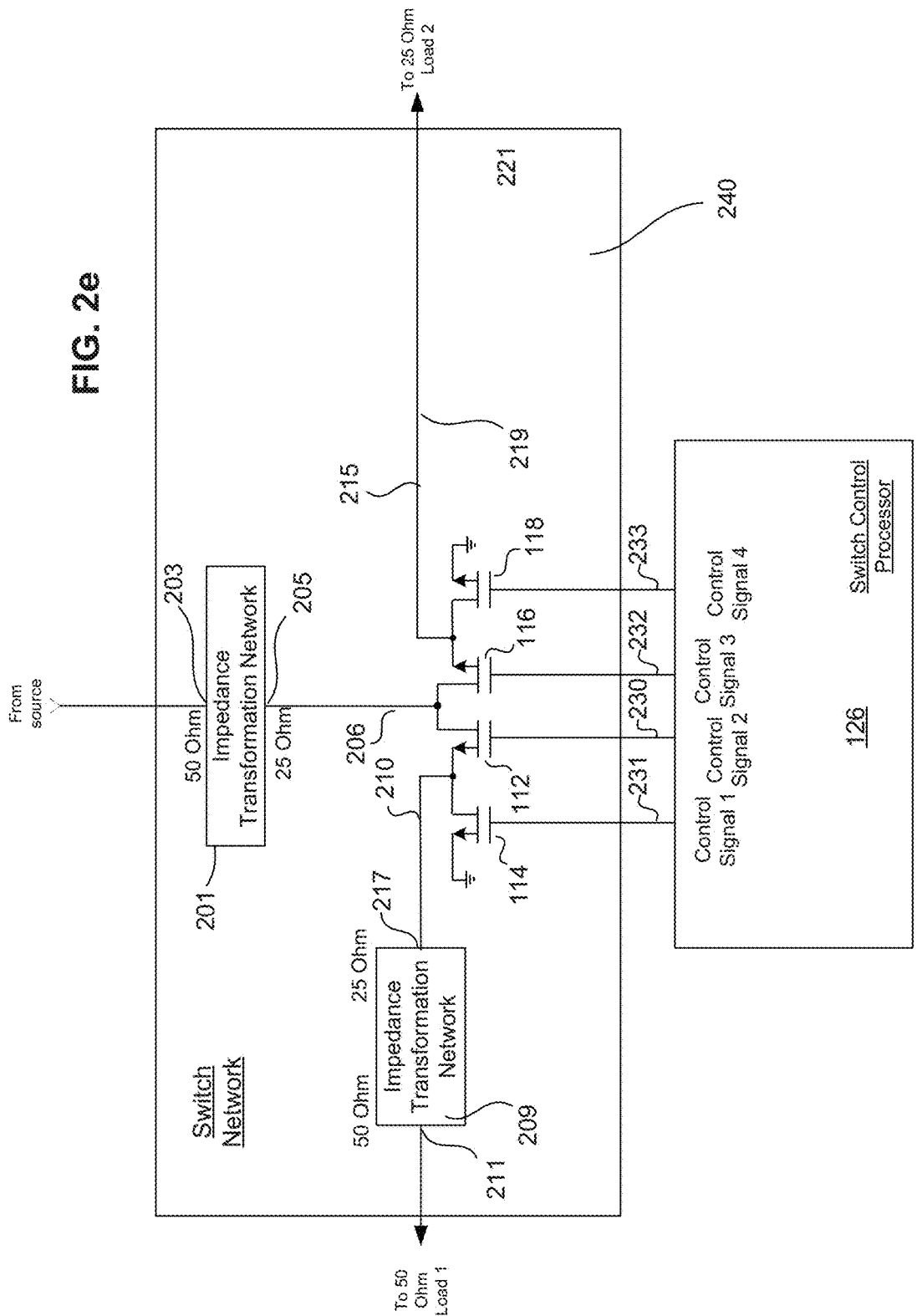

HIGH POWER HANDLING SWITCH USING REDUCED OPERATING IMPEDANCE

BACKGROUND

(1) Technical Field

The disclosed methods and apparatus relate to switches for controlling high power signals and more particularly to switches having increased power handling capability.

(2) Background

As the use of wireless communications increases as a part of daily life, through the use of cellular telephones, wirelessly connected computers and the rise of the "internet of things" (TOT), there is a continuously increasing demand for switches that can control the connection of signals between an antenna and a transceiver. FIG. 1 is an illustration of the basic architecture of a transceiver 100. The transceiver 100 includes an antenna 102 connected to a first port 104 of a three-port RF circulator 106. The three-port circulator 106 has a relatively low impedance for signals between clockwise adjacent ports (i.e., port-to-port in the direction as indicated by the arrow of FIG. 1). The three-port circulator 106 has a relatively high impedance between counterclockwise adjacent ports. Accordingly, there is a low impedance path through the circulator from the first port 104 to a second port 108. Likewise, there is a relatively low impedance from the second port 108 to a third port 124 and from the third port 124 to the first port 104. However, in the other direction through the circulator 106, there is a relatively high impedance from the first port 104 to the third port 124, from the third port 124 to the second port 108 and from the second port 108 to the first port 104.

The second terminal 108 of the circulator 106 is coupled to a transmit/receive switch having a first "through switch" 112, a first "shunt switch" 114, a second through switch 116 and a second shunt switch 118. The terminal 108 of the circulator is coupled to a first signal terminal of the first through switch 112 and to a first signal terminal of the second through switch 116. In some cases, the switches 112, 114, 116, 118 are field effect transistors (FETs), and the first signal terminals of the switches 112, 114, 116, 118 are the drains of the FETs. When the switches 112, 114, 116, 118 are FETs, the second signal terminals of the switches 112, 114 116, 118 are the sources of the FETs. Each switch 112, 114, 116, 118 has a control terminal. In cases in which the switches 112, 114, 116, 118 are FETs, the control terminals of the switches 112, 114, 116, 118 are the gates of the FETs. In some cases, the drain and source of the FETs used to implement the through switches 112, 114, 116, 118 are interchangeable.

The second signal terminal of the first through switch 112 is coupled to the first signal terminal of the first shunt switch 114 and to the input of a load 117 or other such circuit, such as a terminator or a detector. In some embodiments, the load 117 is a 50 ohm terminator or detector. A second signal terminal of the first shunt switch 114 is coupled to ground. The second signal terminal of the second through switch 116 is coupled to an input of a low noise amplifier (LNA) 120 and also to the first signal terminal of the second shunt switch 118. The second signal terminal of the second shunt switch 118 is coupled to ground.

In receive mode, the four switches work together to couple signals from the antenna 102 to the input of the LNA 120 and to shunt the input of the load 117 to ground. That is, by turning on the second through switch 116 and turning off the second shunt switch 118, signals output from the second port 108 of the circulator 106, are routed through the low impedance path established through the second through switch 116 and are applied to the input of the LNA 120. The relatively high impedance of the non-conducting ("OFF") second shunt switch 118 blocks the signal from shunting to ground. It should be noted that throughout this disclosure, the term "on" is used to refer to the operational state of a FET or other switching device in which there is a low impedance between the first signal terminal and the second signal terminal. Likewise, the term "off" is used to refer to the operational state in which a high impedance is presented between the signal terminals of the switch (e.g., drain and source for embodiments in which the switches are FETs).

Switch 112 is off, and so disconnects the load 117 from the circulator 106. Shunt switch 114 is on, and so shunts the input of the load to ground. In some cases, each switch 112, 114, 116, 118 is controlled by a unique control signal 132, 133, 130, 131. Typically, either the LNA 120 or the load 117 is coupled to the second port 108 of the circulator 106 at any particular time and the other is shunted to ground. More particularly, when the transceiver 100 is in receive mode, the LNA 120 is coupled to the second port 108 of the circulator 106 and the input to the load 117 is shunted to ground. When the transceiver 100 is in transmit mode, the load 117 is coupled to the second port 108 of the circulator 106 and the input to the LNA 120 is shunted to ground.

In transmit mode, the transmit amplifier 122 outputs a transmit signal that is coupled through the third port 124 of the circulator 106 to the first port 104 of the circulator 106. As noted above, the circulator 106 has a relatively high isolation for a signal traveling in the direction from the input port 104 to the third port 124 and to the output from the second port 108. Therefore, the power applied to the input port 124 is principally coupled to the antenna 102. Nonetheless, in order to protect the LNA 120, the second through switch 116 disconnects the LNA 120 from the antenna 102. In addition, the second shunt switch 118 further isolates the input of the LNA 120 by coupling the input of the LNA 120 to ground through the second shunt switch 118. Any power that is inadvertently coupled to the second port 108 of the circulator is isolated from the input of the LNA 120 by the high impedance between the first signal terminal and the second signal terminal of the second through switch 116, which is off during transmit mode and also by the low impedance to ground presented by the second shunt switch 118 which is on during transmit mode. In addition, in transmit mode, the input of the 50 ohm load 117 is connected to the second port 108 of the circulator 106 to provide a proper load for the circulator 106. The first through switch 112 is turned on to provide a low impedance path from the circulator 106 to the load 117 and the first shunt switch 114 is turned off to disconnect the input of the load 117 from ground.

In some cases, a switch control processor 126 determines when the transceiver 100 is in transmit mode and when the transceiver 100 is in receive mode. The switch control processor 126 can be as simple as some circuitry in the modulator/demodulator of the transceiver for determining when data is ready to be sent. Alternatively, the switch control processor 126 can be a more sophisticated programmable device that determines the mode of the transceiver 100 based on several factors. The through switch 116 is turned on by applying a first receive control signal 130 to the control terminal (e.g., the gate) of the through switch 116. A second receive control signal 133 is applied to the control terminal of the shunt switch 114. In some cases, the first and second receive control signals 130, 133 are generated by the switch control processor 126. A first transmit control signal 132 is applied to the control terminal of the through switch 112. A second transmit control signal 131 is applied to the control terminal (e.g., the gate) of the second shunt switch 118.

When implementing the second through switch 116 and the second shunt switch 118 as FET switches, the first through switch 116 must be capable of sustaining a relatively high drain to source voltage without breaking down when not conducting in the transmit mode. In addition, first shunt switch 114 is also subject to have relatively large voltages applied across the drain to source during transmit mode due to the antenna reflections. Therefore, the second through switch 116 and the first shunt switch 114 must be relatively large. Typically, this is implemented by stacking several individual FETs together to form the second through switch 116 and the first shunt switch 114. The number of FETs that are stacked depends upon several factors, including the drain to source voltage that the switch 116 and switch 114 are intended to withstand. In some cases, the second shunt switch 118 and the first through switch 112 also comprise several stacked FETs. A "stacked FET" comprises at least two FETs having the source of a preceding FET connected to the drain of a subsequent FET, thus placing the FETs in series, each FET being controlled by essentially the same gate signal such that all of the FETs of the stack turn on and off together. The total width of each FET in the stack is typically increased to compensate for increases in the ON resistance ($R_{on}$) that would otherwise occur due increasing the number of series FETs. Increasing the total width of each FET helps maintain an overall low $R_{on}$ when the FETs are switched on. It should be noted that when the FETs are stacked each of their $C_{off}$ capacitances are connected in series. This lowers the total $C_{off}$ of the stack. However, widening each FET to reduce the total on-resistance results in an increase to the $C_{off}$ of each FET and so the total $C_{off}$ for the stack is essentially the same. In some cases, the drain and source of the FETs used to implement the stacked FETs switches are interchangeable In addition, each FET of a stacked switch has a capacitance $C_{gs}$ between the gate and source. In addition, there is a capacitance $C_{gd}$ between the gate and drain. These capacitances, $C_{gs}$ and $C_{gd}$, are in parallel with the intrinsic drain-to-source channel capacitance, $C_{ds}$. This causes the total capacitance when the switch is off (i.e., $C_{off}$) to increase for a given device. In addition, there are parasitic capacitances associated with each FET of a stacked switch. That is, the stack has a larger active surface area, which results in larger parasitics to ground. Due to the increased parasitics when the FETs are stacked, there is no guarantee that the voltage division among the stacked FETs will be equal. Accordingly, higher power (voltage) creates significant challenges. Therefore, while stacking several FETs increases the power handling capability of the switch, using too many FETs results in diminishing returns due to the summing of the parasitic ground and $C_{gs}$, $C_{gd}$ capacitances. Therefore, there is a need for switches that can control the connections between the transmit, receive and load sections of a transceiver without suffering the negative impact of increased capacitances associated with stacking too many FETs.

SUMMARY

The disclosed method and apparatus provides an architecture that increases the power that handling capability of a switch network, such as a switch network used as a transmit/receive switch within a transceiver. An impedance transformation network is introduced at each of the terminals of the switch network. Each impedance transformation network transforms the impedance on the switch side of the network to a lower impedance with respect to the impedance at the component side of the network. Transforming the impedance at the switch side to a lower impedance allows the switch to handle signals of the same power level with a lower voltage being applied to the switch terminals. In embodiments in which the switches of the switch network are implemented as field effect transistors (FETs), the result is that the switch can handle signals at higher power levels with fewer stacked FETs.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 2a is an illustration of the architecture of a switch network in accordance with some embodiments of the disclosed method and apparatus.

FIG. 2c is an illustration of yet another embodiment of a switch network having only one through switch and one shunt switch.

FIG. 2d is an illustration of a switch network including impedance transformation networks within a switch network.

FIG. 2e is an illustration of an embodiment of a switch network having only two impedance transformation networks.

FIG. 2f is an illustration of an embodiment of a switch network having a switchable impedance transformation network in place of the first impedance transformation network shown in FIG. 2a.

DETAILED DESCRIPTION OF THE INVENTION

Figure 1:
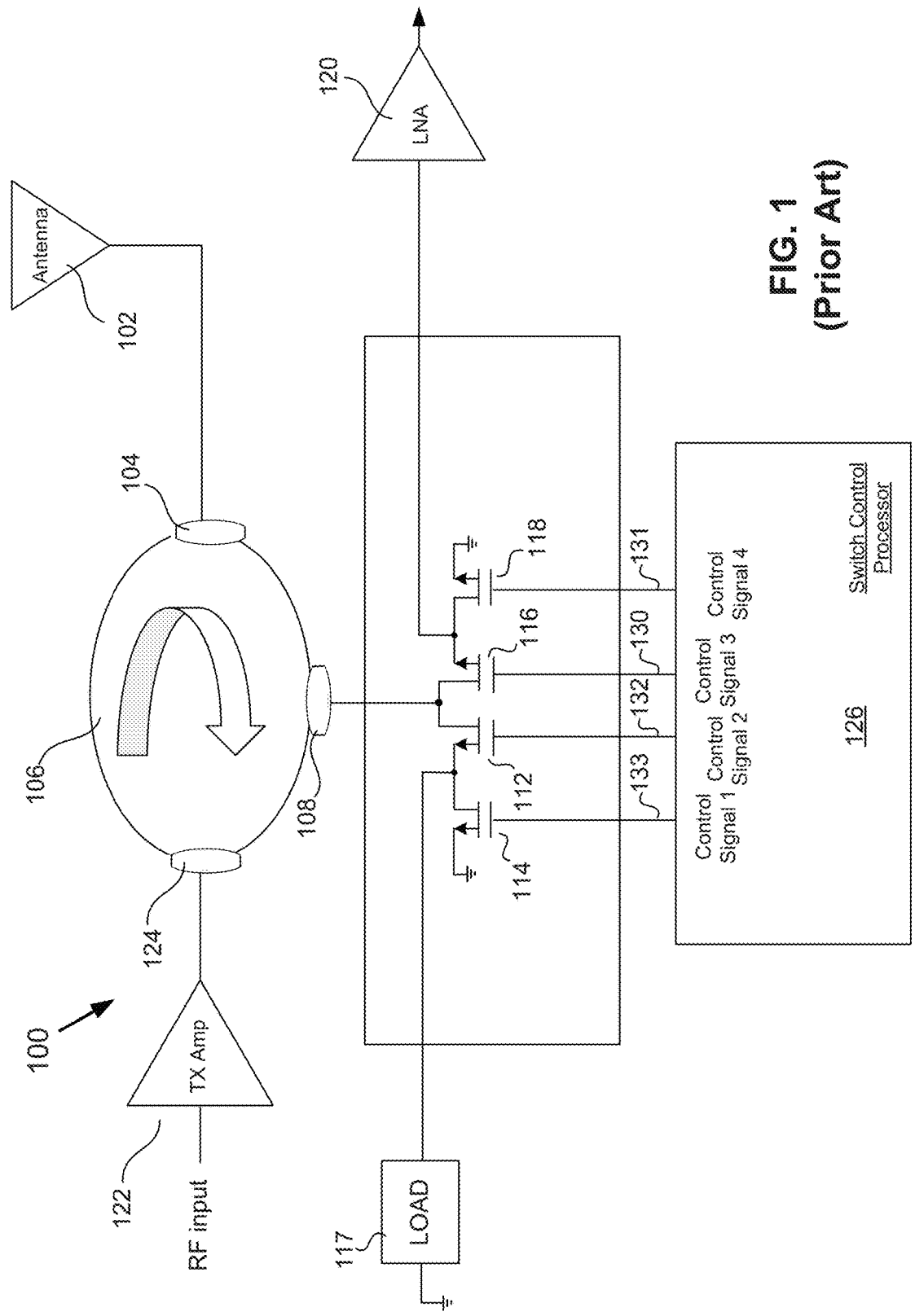
FIG. 1 is an illustration of the basic architecture of a transceiver in accordance with the prior art.

FIG. 2a is an illustration of a reduced operating impedance (ROI) switch network 202 in accordance with some embodiments of the presently disclosed method and apparatus. Some embodiments of the ROI switch network 202 (hereafter referred to as the "switch network") comprise three impedance transformation networks 201, 209, 213 and four switches: a first "through switch" 112, a first "shunt switch" 114, a second through switch 116, and a second shunt switch 118. Each of the switches 112, 114, 116, 118 can be implemented as a stacked field effect transistor (FET). Only the shunt switch 118 is shown as a stacked FET for the sake of simplifying the figure. Furthermore, the number of FETs used to implement the stacked FET can vary depending upon the application. It should be understood that the other switches 112, 114, 116 might also be implemented as stacked FETs. It will be clear to those skilled in the art that the number of switches and impedance transformation networks can vary without departing from the scope of the disclosed method and apparatus. That is, the particular switch network having one source and two loads is merely shown as one example of the general principle of providing impedance transformation networks to reduce the amount of voltage that each switch of the network must be able to handle. This will become clearer upon reading the following disclosure in full.

One use for the switch network 202 is to connect a source to either a first load or a second load. When the source is connected to the first load, the second load is isolated from both the source and the second load. Likewise, when the source is connected to the second load, the first load is isolated from the source and from the second load.

In some embodiments, a switch control processor 126 generates four control signals 230, 231, 232, 233. The control signals are coupled to control ports of each of the four switches 112, 114, 116, 118. The state of each control signal 230, 231, 232, 233 determines the state of an associated one of the switches 112, 114, 116, 118. In a first mode, the first through switch 112 and the second shunt switch 118 are closed (i.e., turned "on") in response to the state of the associated control signals 230, 233. In some embodiments, the same control signal can be used to control both the first through switch 112 and the second shunt switch 118. In addition, in the first mode, the first shunt switch 114 and the second through switch 116 are opened (i.e., turned "off") in response to the state of the associated control signals 231, 232. In some embodiments, the same control signal can be used to control both the second through switch 114 and the first shunt switch 116. In addition, since the two control signals are always in opposite states, the same signal can be used to control all four switches 112, 114, 116, 118 if the control state (the logical state that causes the switch to be open) of the first through switch 112 and the second shunt switch 118 is the opposite of the control state of the first shunt switch 114 and the second through switch 116.

A source is coupled to a first external terminal 203 of the impedance transformation network 201. The source provides a signal that is coupled through the impedance transformation network 201 to an internal terminal 205 of the impedance transformation network 201. The impedance transformation network 201 transforms an external impedance to an internal impedance. In some embodiments, the internal impedance is less than the external impedance. In addition, the external impedance is equal to the characteristic impedance of the source. In some such embodiments, the internal impedance is 25 Ohms and the external impedance is 50 Ohms.

The internal terminal 205 of the impedance transformation network 201 is coupled to a first terminal of the first through switch 112. Since the first through switch 112 is closed, the signal is coupled through to an internal terminal 217 of the second impedance transformation network 209. The second impedance transformation network 209 transforms an internal impedance to an external impedance and outputs the signal to a first load having a characteristic impedance equal to the external impedance.

The internal terminal 205 of the impedance transformation network 201 is also coupled to a first terminal of second through switch 116. As noted above, in the first mode, the second through switch 116 is open. Therefore, the signal does not pass through the second through switch 116. The second terminal of the second through switch 116 is coupled to a first terminal of the second shunt switch 118 and to the internal terminal 219 of the third impedance transformation network 213. Furthermore, as noted above, the second shunt switch 118 is closed in the first mode. The external terminal 221 of the third impedance 213 is coupled to a second load having a characteristic impedance equal to the external impedance. The third impedance transformation network 213, similar to the first and second impedance transformation network, transforms the impedance at the internal terminal 219 to the impedance at the external terminal 221. With the second shunt switch 118 closed, the second load is coupled to a reference terminal. In some embodiments, the reference terminal is coupled to ground. Alternatively, the reference terminal is coupled to a reference potential other than ground. In some such embodiments, the reference terminal and the ground (or other reference potential) to which it is coupled are internal to the switch network 202. Alternatively, the reference terminal may provide access to a reference potential, such as ground, that is external to the switch network 202. Coupling the internal terminal 219 to a reference potential, such as ground, thus isolates the second load from the first load and from the source.

In the second mode, the state of each of the switches is reversed such that the first through switch 112 and the second shunt switch 118 are open and the second through switch 116 and the first shunt switch 114 are closed. Therefore, the source is coupled through the first and third impedance transformation networks 201, 213 to the second load and the first load is coupled to a reference potential, such as ground. The first load is thus isolated from the second load and from the source.

As noted above, each of the switches 112, 114, 116, 118 can be implemented as one or more stacked FETs. Implementing a switch as a stacked FET allows the switch to withstand higher voltage levels. Thus, by fabricating the switch network 202 using stacked FETs, the switch network 202 can handle signals at higher power levels. Providing impedance transformation networks at each port 206, 210, 215 that transform an external impedance to an internal impedance that is less than the external impedance, where the external impedance is equal to the impedance of the source and the first and second load, further increases the amount of power that the switch network 202 can handle. That is, using a switch network 202 that has impedance transformers at each port that transform the external characteristic impedance to an internal characteristic impedance that is half that of the other components of the transceiver 200 allows the switch network 202 to handle twice the power that it would otherwise be able to handle without such impedance transformers. This can be better understood by noting that:

$$\text{Power}(P) = \text{Voltage}^2(V^2)/\text{Resistance}(R) \quad \text{EQ. 1}$$

In embodiments in which the external impedance is 50 Ohms and the internal impedance is 25 Ohms, the relationship shown in EQ. 1 indicates that reducing the internal impedance (i.e., the characteristic impedance on the switch network 202 side from 50 Ohms to 25 Ohms results in the switch 202 being able to handle twice the power with the same voltage swing at the switch terminals 206, 210, 215, as is discussed in more detail in later discussions below. In an alternative embodiment, the ratio of the impedance on the switch network 202 side (i.e., the internal impedance) to the impedance of the other components (the external impedance) could be greater or less than the 1:2. Furthermore, the particular values of the relatively high impedance of the components and the value of the relatively low impedance of the transmit/receive switch 202 may vary from that shown in FIG. 2a. Still further, in some embodiments in which it is desirable to reduce the current through the switch rather than the voltage swing at the terminals of the switch, the external impedance may be less than the internal impedance.

Figure 2B:
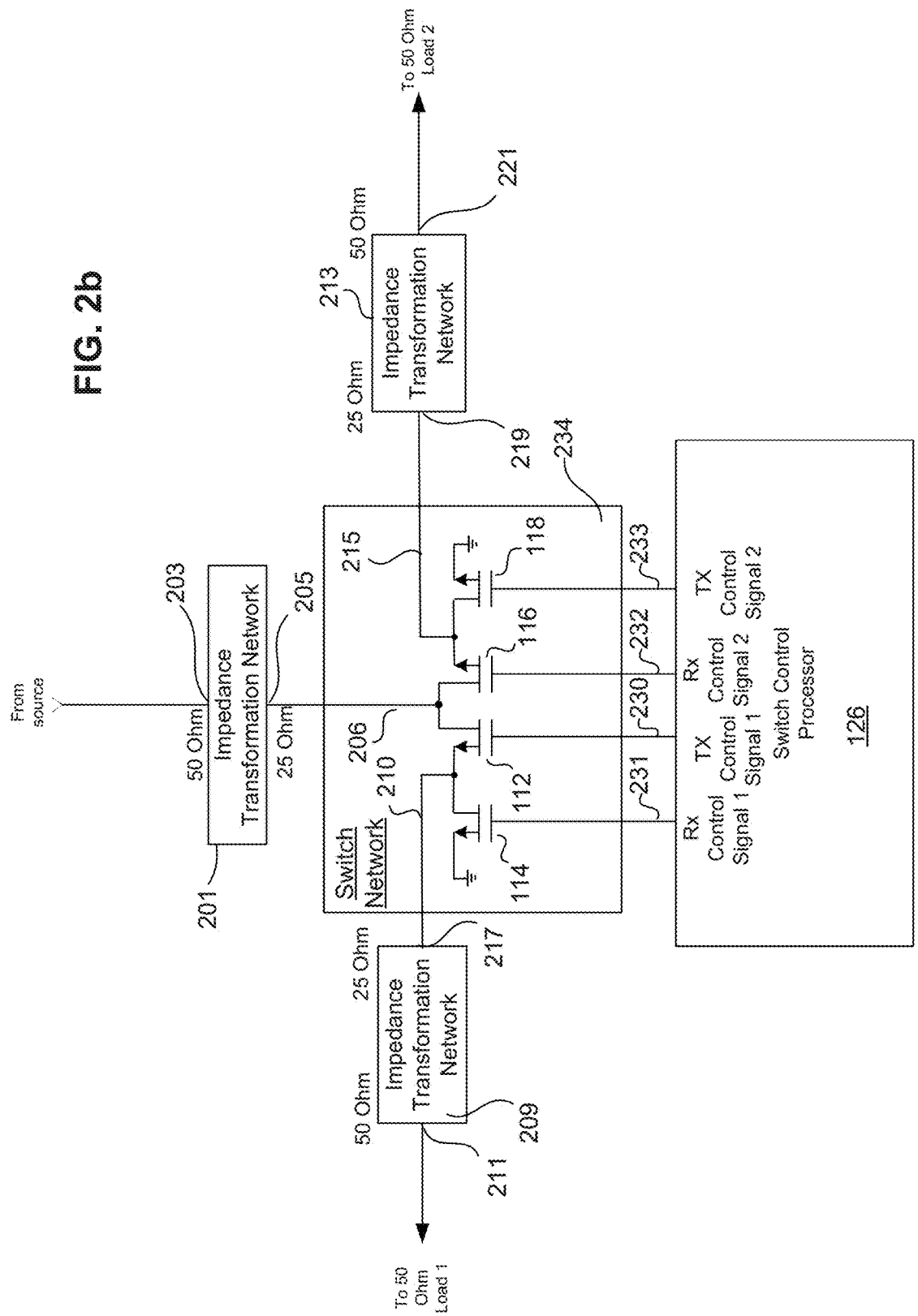
FIG. 2b is an illustration of the architecture of a switch network as used in a transceiver in accordance with some embodiments of the disclosed method and apparatus.

FIG. 2b is an illustration of a switch network 234 similar to the switch network 202 of FIG. 2a. However, the impedance transformation networks 201, 209, 213 are not within the switch network 234. In this embodiment, the impedance transformation networks are external to the switch network 234.

FIG. 2c is an illustration of yet another embodiment of a switch network 236 having only one through switch 116 and one shunt switch 118. The switch network 236 is capable of handling increased power when switching from a first mode in which a source is connected to a load and a second mode in which the load is isolated from the source. The switch network 236 is coupled to external impedance transformation networks 201, 213. Alternatively, as shown in FIG. 2d, a switch network 238 may include the impedance transformation networks 201, 213 within a switch network 238. In some embodiments, the shunt switch 118 is not required, leaving only the through switch 116 within the switch network 236.

FIG. 2e is an illustration of an embodiment of a switch network 240 having only two impedance transformation networks 201, 209. The second load has a characteristic impedance of 25 Ohms, making it unnecessary to transform the impedance of the terminal 215 of the switch network. In other embodiments, both loads may have characteristic impedances that are each equal to the internal impedance (e.g., 25 Ohms in the embodiment shown in FIG. 2e).

Figure 2F:
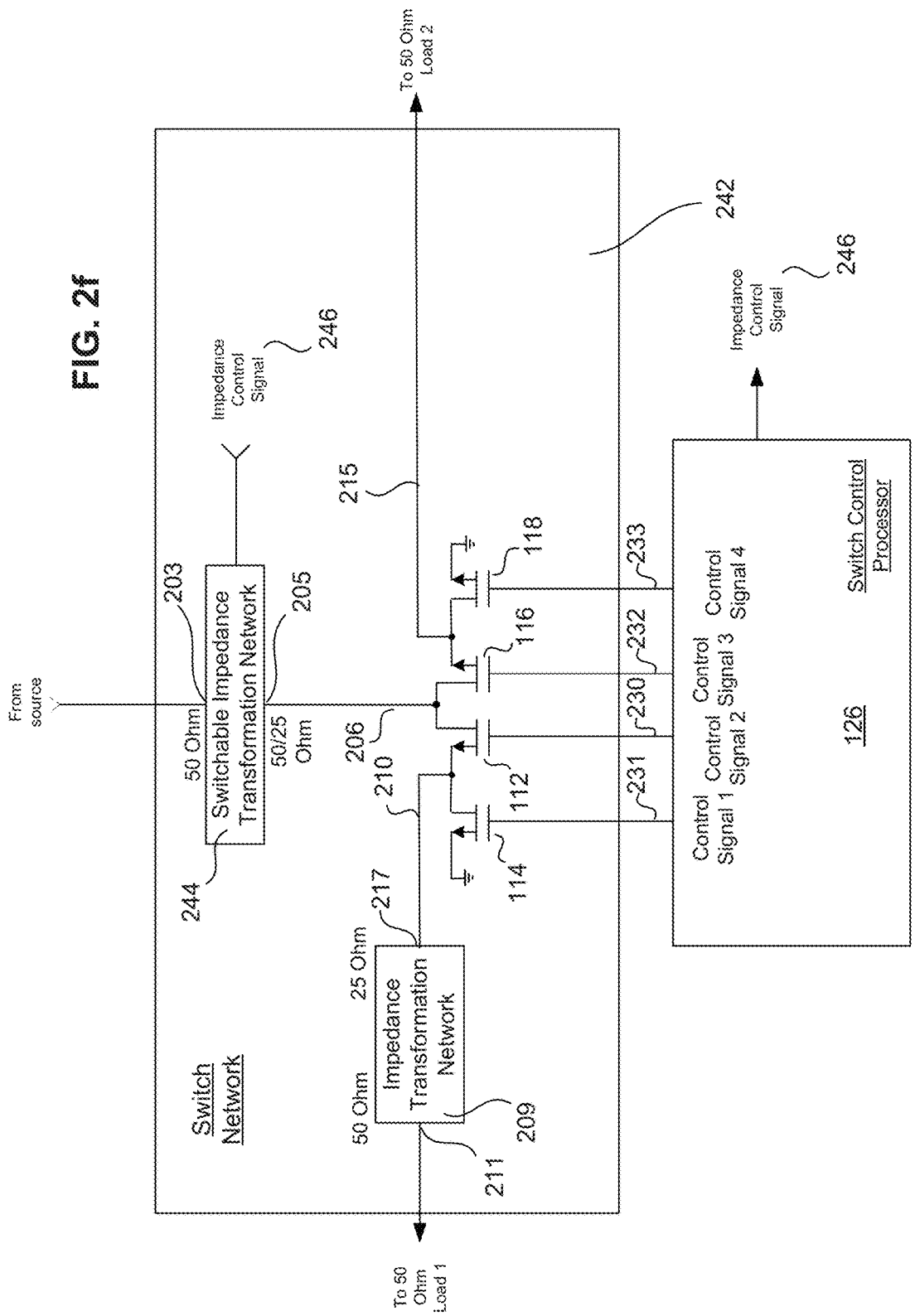

FIG. 2f is an illustration of an embodiment of a switch network 242 having a switchable impedance transformation network 244 in place of the first impedance transformation network 201 shown in FIG. 2a. In addition, the switch network 242 has only two impedance transformation networks 244, 209. The switchable impedance transformation network 244 can either provide an impedance transformation from the internal impedance to the external impedance (similar to the impedance transformation networks 201, 209, 213 discussed previously, or alternatively, the switchable impedance transformation network 244 can be controlled to provide a bypass mode in which the impedance at the internal terminal 205 is equal to the external impedance. An impedance control signal 246 generated by the switch control processor 126 controls the switchable impedance transformation network 244 to operate in bypass mode when load 2 is connected to the source. Having a switchable impedance transformation network 244 can be useful when the amount of power that is to be coupled from the source to load 2 is less than the amount of power that is coupled from the source to load 1. Therefore, there is less need to increase the power handling capability of the switch network 242 when coupling the source to the second load.

Figure 2G:
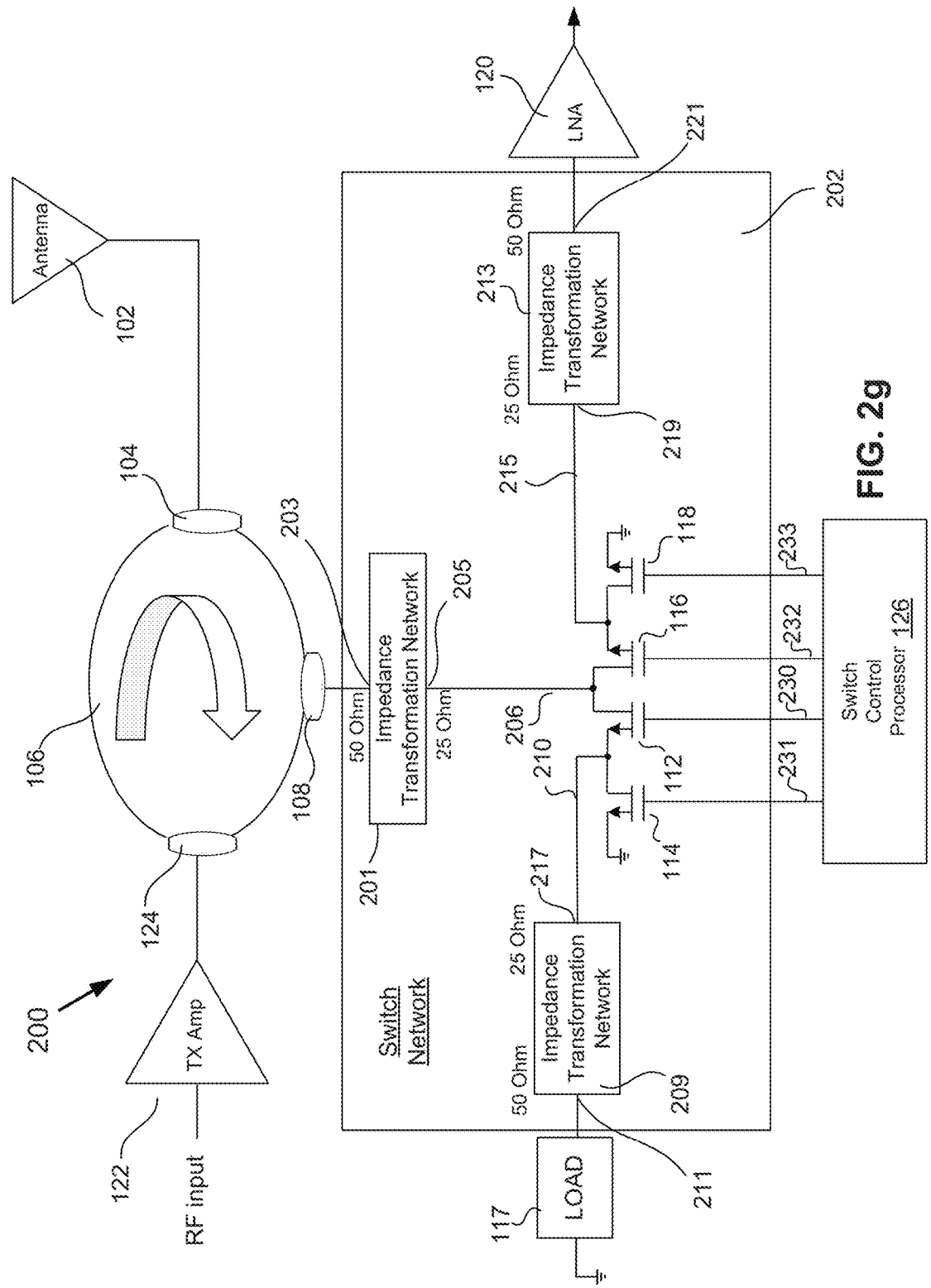
FIG. 2g is an illustration of the architecture of a transceiver in accordance with some embodiments of the disclosed method and apparatus.

FIG. 2g is an illustration of the architecture of a transceiver 200 in accordance with some embodiments of the disclosed method and apparatus. A three-port circulator 106 has a first port 104 coupled to an antenna 102, a second port 108 coupled to a three-terminal transmit/receive switch 202 and a third port 124 coupled to a transmit amplifier 122. When the transceiver 200 is in transmit mode, the transmit amplifier 122 outputs signals to be transmitted. The output of the transmit amplifier 122 is coupled to the third port 124 of the circulator 106. Signals coupled to the third port 124 of the circulator 106 are coupled clockwise through the circulator 106 and output from the first port 104 of the circulator. The signals are then coupled to the first port 104 for transmission. In transmit mode, any leakage from the third port 124 or reflections from the first port 104 appear at the second port 108 of the circulator 106.

The second port 108 of the circulator 106 is coupled to the external terminal 203 of the transmit/receive switch 202. In transmit mode, the transmit/receive switch 202 couples the second port 108 of the circulator 106 to a load 117 or other circuit, such as a terminator or a load. In some embodiments, the load 117 is a 50 Ohm terminator or detector. In transmit mode, the transmit/receive switch 202 also couples the input of a low noise amplifier (LNA) 120 to a reference potential, such as ground. The transmit/receive switch 202 is controlled through four switch control inputs to the switch 202. In some embodiments, each switch control signal 230, 231, 232, 233 is generated by a switch control processor 126. Details of the operation of the transmit/receive switch 202 are provided below.

In some embodiments, in receive mode, the transmit amplifier 122 is turned off. Signals received by the antenna 102 are coupled to the first port 104 of the circulator 106. The signals are then output from the second port 108 of the circulator 106 with relatively low insertion loss. As noted above, the second port 108 of the circulator 106 is coupled to the external terminal 203 of the transmit/receive switch 202. In receive mode, the switch 202 couples the received signals from the second port 108 of the circulator 106 to the input of the LNA 120 and further couples the input of the 50 Ohm load 117 to a reference potential, such as ground.

In some embodiments, a first impedance transformation network 201 within the transmit/receive switch 202 provides an interface between the second port 108 of the circulator 106 and the transmit/receive switch 202. A second impedance transformation network 209 provides an interface between the input of the load 117 and the transmit/receive switch 202. A third impedance transformation network 213 provides an interface between the input of the LNA 120 and the transmit/receive switch 202. Each of the three impedance transformation networks has an external terminal 203, 211, 221 and an internal terminal 205, 217, 219. Each impedance transformation network 201, 209, 213 transforms the impedance of the respective external terminal 203, 211, 221 from a first relatively high impedance "presented" at the external terminal 203, 211, 221 to a second relatively low impedance presented at the respective internal terminal 205, 217, 219. In some embodiments, the impedance at terminals of different impedance turning networks 201, 209, 213 may be different. However, in the embodiment shown in FIG. 2g, the impedance looking into the switch 202 through the external terminal 203 is a first relatively high impedance of 50 Ohms. This relatively high impedance matches the characteristic impedance of the other components of the transceiver 200. The impedance looking from inside the switch 202 outward through the internal terminal 205 is a second relatively low impedance of 25 Ohms in the embodiment shown in FIG. 2g. Similarly, the impedance looking into the switch 202 through the external terminal 211 (i.e., presented at the external terminal 211) is equal to the first relatively high impedance of 50 Ohms. The impedance looking from the switch 202 outward through the internal terminals 217, 219 (i.e., presented at the internal terminals 217, 219) is equal to 25 Ohms.

The characteristic impedance of the components of the transmit/receive switch 202 is also equal to the relatively low impedance and so in the embodiment shown in FIG. 2g, the internal characteristic impedance of the switch 202 is half that of the characteristic impedance of the other components of the transceiver 200.

The transmit/receive switch 202 further comprises a first through switch 112, a first shunt switch 114, a second through switch 116 and a second shunt switch 118. In some embodiments, the switches 112, 114, 116, 118 are FETs, and the first signal terminals of the switches 112, 114, 116, 118 are the drains of the FETs. When the switches 112, 114, 116, 118 are FETs, the second signal terminals of the switches 112, 114 116, 118 are the sources of the FETs. The control terminals of the switches 112, 114, 116, 118 are the gates of the FETs. In some cases, the drain and source of the FETs used to implement the through switches 112, 114, 116, 118 are interchangeable.

The 25 Ohm internal terminal of the impedance transformation network 201 is coupled to the first signal terminal of a first through switch 112 (in embodiments in which the switch 112 is implemented as an FET). The 25 Ohm terminal of the first impedance transformation network 201 is also coupled to a first signal terminal of a second through switch 116. The second signal terminal of the first through switch 112 is coupled to the 25 Ohm internal terminal 217 of the second impedance transformation network 209. The 50 Ohm external terminal 211 of the impedance transformation network 209 is coupled to the input of the 50 Ohm load 117. The gate of the first through switch 112 is coupled to the transmit control signal 230. The first signal terminal of a first shunt switch 114 is coupled to the second signal terminal of the first through switch 112 and to the 25 Ohm input of the second impedance transformation network 209. The second signal terminal of the first shunt switch 114 is coupled to a reference potential, such as ground. The gate of the first shunt switch 114 is coupled to the receive control signal 231. The first signal terminal of a second shunt switch 118 is coupled to the second signal terminal of the second through switch 116 and to the 25 Ohm internal terminal 217 of the third impedance transformation network 213. The 50 Ohm external terminal 221 of the third impedance transformation network 213 is coupled to the input of the LNA 120. The gate of the second through switch 116 is coupled to the receive control signal 232. The gate of the second shunt switch 118 is coupled to the transmit control signal 233.

During transmit mode, the transmit control signals 230, 233 are in an "ON" state. Thus, the transmit control signals 230, 233 turn on the first through switch 112 and the second shunt switch 118. When the first through switch 112 turns on, it connects the load 117 to the second port 108 of the circulator 106 to provide a proper termination for the circulator 106. In some embodiments in which the load is a detector, the detector also provides a potential means for monitoring operation of the transceiver 200. Turning on the second shunt switch 118 provides a relatively low impedance through the second shunt switch 118 to connect the input of the LNA 120 to a reference potential, such as ground (through the impedance transformation network 213). Shunting the input of the LNA 120 to a reference potential, such as ground during transmit mode protects the LNA 120 from potential damage.

In addition, the receive control signals 231, 232 are in an "OFF" state during transmit mode. Therefore, the first shunt switch 114 and the second through switch 116 are turned off during transmit mode. Turning off the first shunt switch 114 provides a relatively high impedance between the first signal terminal and the second signal terminal of the shunt switch 114, so removing a reference potential, such as ground from the input of the 50 Ohm load 117. Turning off the second through switch 116 provides a relatively high impedance through the second through switch 116 from first signal terminal to the second signal terminal to isolate the input of the LNA 120 from the second port 108 of the circulator 106 during transmit mode.

In receive mode, the transmit control signals 230, 233 are in an OFF state. Therefore, the first through switch 112 is turned off, disconnecting the 50 Ohm load from the second port 108 of the circulator 106. The transmit control signal 233 being in an OFF state causes the second shunt switch 118 to be turned off and so disconnecting the input of the LNA 120 from a reference potential, such as ground.

The receive control signal 231 is in an ON state. Therefore, the second transistor 114 is turned on, thus coupling the input of the 50 Ohm load 117 to a reference potential, such as ground. Furthermore, since the receive control signal 232 is in an ON state, the second through switch 116 is turned on coupling the second port 108 of the circulator 106 to the input of the LNA 120 (through the first and third impedance transformation networks 201, 213).

In some embodiments, the LNA 120 has an input impedance matched to the internal impedance. Therefore, the third impedance transformation network 213 can be removed. Similarly, and in some embodiments, alternatively, the load 117 has a characteristic impedance of 25 Ohms. Thus, the second impedance transformation network 209 can be removed. In some embodiments, similar to the switch network 234 shown in FIG. 2b, impedance transformation networks 201, 209, 213 of the switch network can be outside the switch network.

Figure 3:
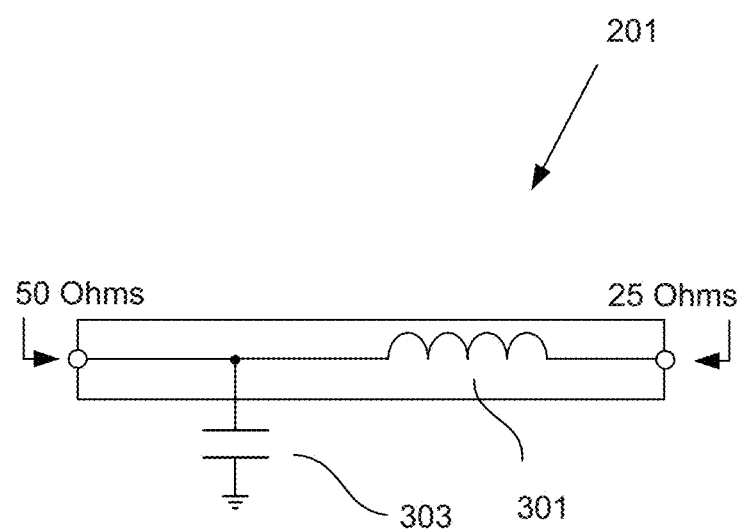
FIG. 3 is an illustration of one way in which impedance transformation networks can be implemented in accordance with some embodiments of the disclosed method and apparatus.

FIG. 3 is an illustration of one embodiment of the impedance transformation network 201, 209, 213. In the example shown in FIG. 3, the impedance transformation network comprises a series inductance 301 and a shunt capacitance 303. This arrangement is commonly referred to as an "L-matching network". The formulas for determining the values of the inductance 301 and capacitance 303 when transforming a 50 Ohm impedance to a 25 Ohm impedance, as shown in FIG. 3, are:

$$Z_l = \sqrt{(50*25) - 25^2} = 2\pi f l \quad \text{EQ. 2}$$

where $Z_l$=the impedance (inductive reactance assuming infinite Q; zero resistance) of the series inductance 301; f is the frequency in Hertz and l is the inductance in henrys.

$$Z_C = 50 * \left(\frac{25}{Z_I}\right) = \frac{1}{(2\pi f C)} \qquad \text{EQ. 3}$$

where $Z_C$=the impedance (capacitive reactance assuming infinite Q; zero resistance) of the shunt capacitor 303 and C is the capacitance in farads.

Figure 4:
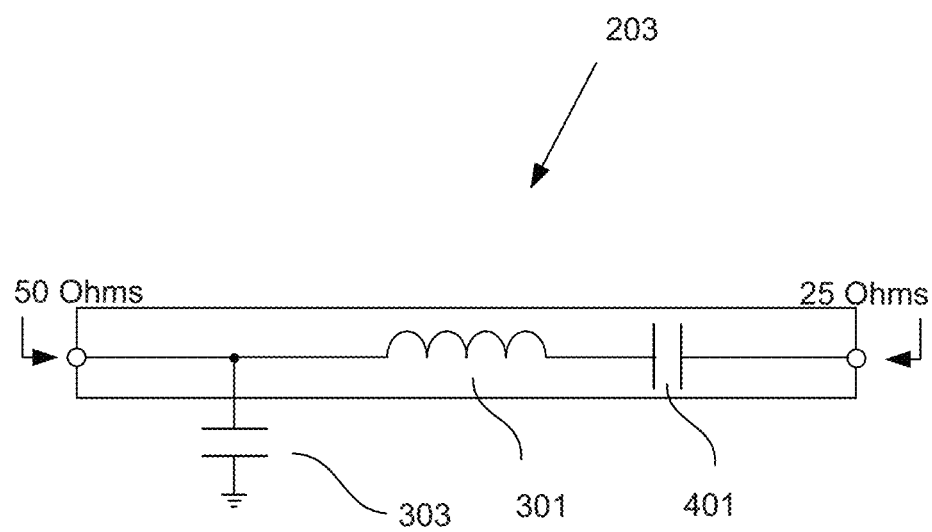
FIG. 4 is an illustration of some embodiments of the impedance transformation network in which the impedance to be matched is not purely resistive and an additional series capacitor is provided to improve the impedance match.
Figure 5:
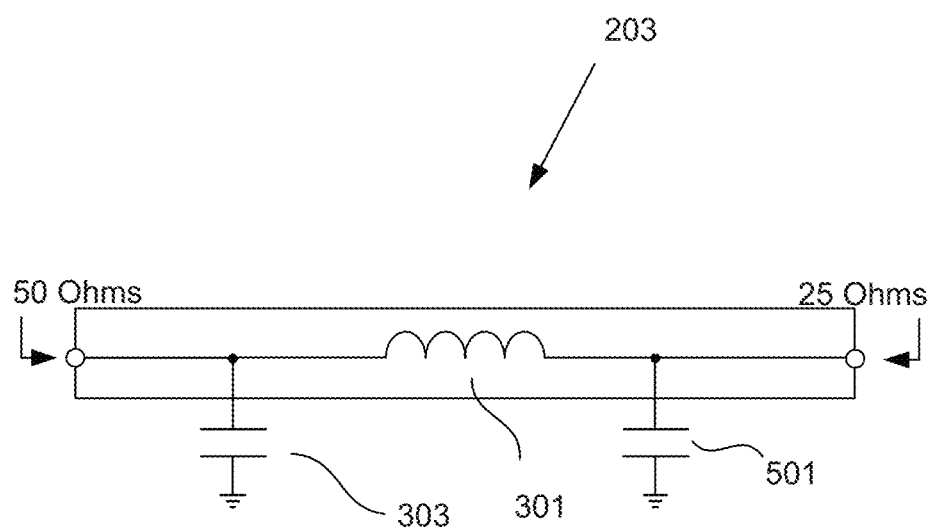
FIG. 5 is an illustration of a Pi-matching network that may be used in some embodiments of the impedance transformation network.
Figure 6:
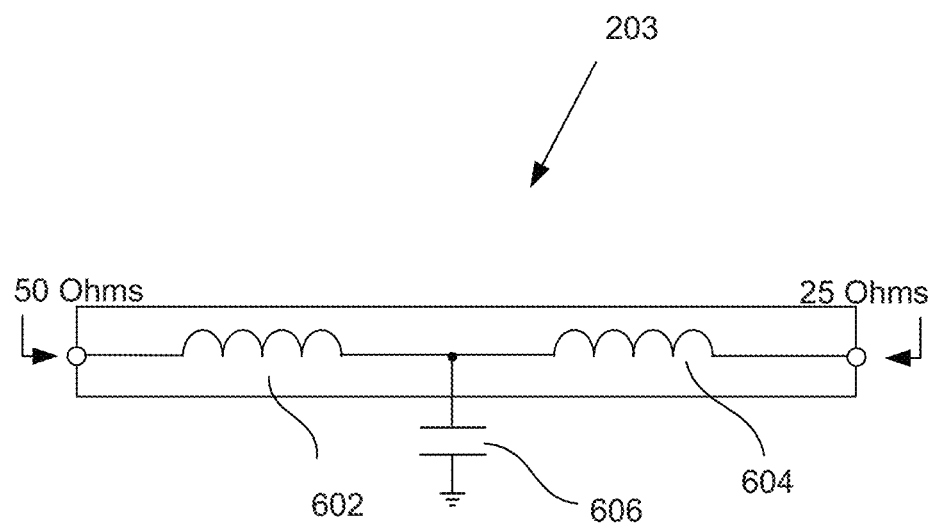
FIG. 6 is an illustration of a T-matching network that may be used in some embodiments of the impedance transformation network.

In some such embodiments, the inductance 301 can be provided by a conductor (i.e., a conductive trace) of the semiconductor device on which the transmit/receive switch 202 is fabricated. Alternatively, the inductor 301 can be fabricated on a semiconductor coupled to the transmit/receive switch 202. In other embodiments, the series inductance 301 can be a discrete component. Likewise, the shunt capacitance 303 can be fabricated on the semiconductor device on which the transmit/receive switch 202 is fabricated. Alternatively, the capacitance 303 can be fabricated on a semiconductor that is external to the switch 202 or as a discrete component. The use of a simple L-matching network makes the transceiver frequency sensitive. In alternative embodiments, baluns could be used to implement the impedance transformation networks 201, 209, 213, thus reducing the frequency sensitivity and making the transceiver capable of operating over a broader frequency range. Furthermore, several other networks are well known to perform the desired impedance matching, including "Pi-matching networks", "T-matching networks". Still further, in cases in which the impedance to be matched is not purely resistive, an additional series capacitor 401 may be provided to improve the impedance match, as shown in FIG. 4. FIG. 5 is an illustration of a Pi-matching network 500. The Pi-matching network has an additional shunt capacitor 501 that shunts the 25 Ohm side of the network to a reference potential, such as ground. FIG. 6 is an illustration of a T-matching network. The T-matching network comprises two series inductances 602, 604 and a shunt capacitance 606.

The L, Pi, and T-matching networks each have advantages and disadvantages. The advantage of the L-matching network is that it is easy to build, since it has only two components to be controlled for adjusting the real and imaginary part of the impedance. In addition, the L-matching network typically has practical component values. That is, T and Pi configurations can require either very low inductance values or very high capacitance values that are difficult or impractical. Furthermore, T and Pi networks require more complex matching network design, since there is a need to control three components. This can tend to make such networks less practical.

Figure 7:
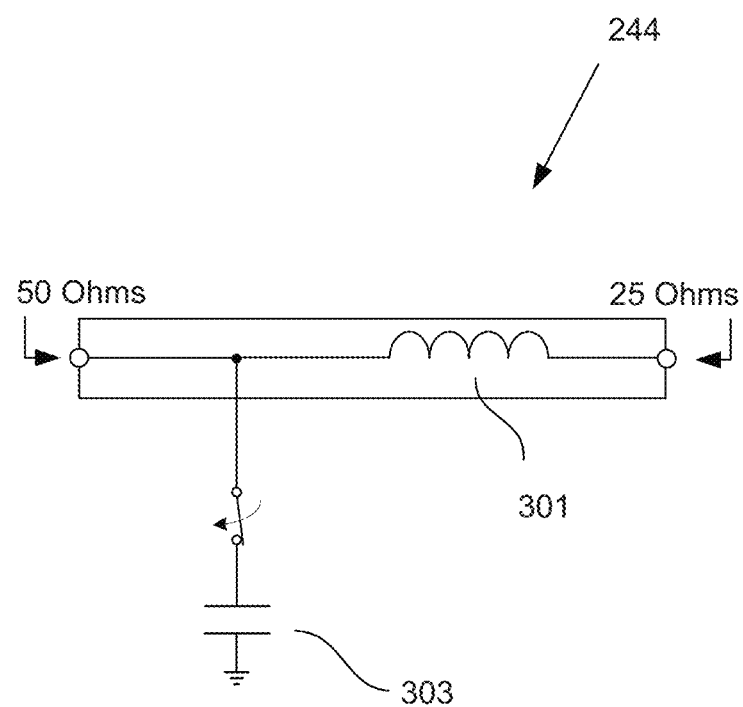
FIG. 7 is an illustration of one embodiment of a switchable impedance transformation network.

FIG. 7 is an illustration of one embodiment of a switchable impedance transformation network 244, such as is shown to be used in the switch network 242 of FIG. 2f. In addition to the components present in the impedance transformation network 201 shown in FIG. 3, the switchable impedance transformation network 244 comprises a switch 703 that allows the capacitor 303 to be removed from the inductor 301. In the inductor 301 of the switchable impedance transformation network 244 is a transmission line having a characteristic impedance of essentially 50 Ohms when the capacitor 303 is not coupled to the inductor 301 by the switch 703.

Figure 8:
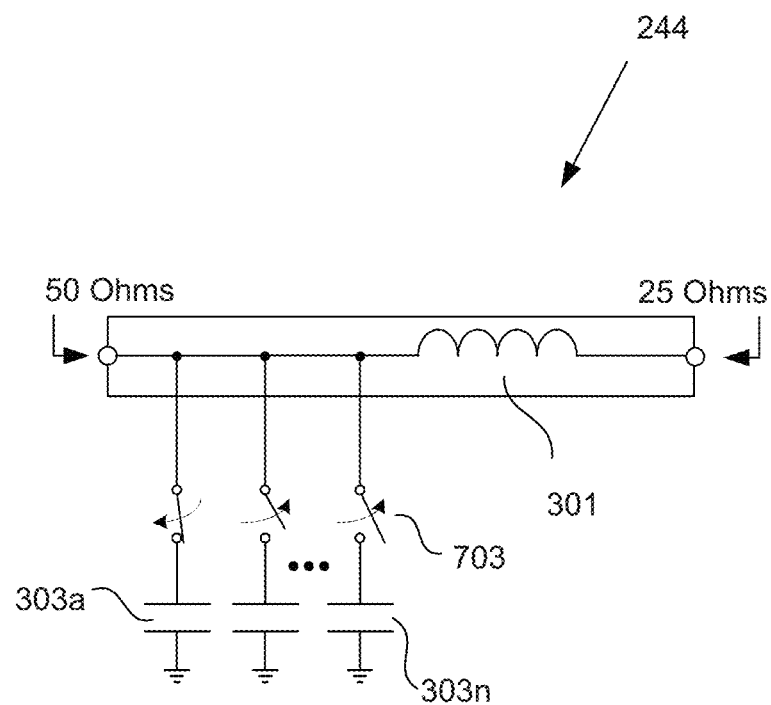
FIG. 8 is an illustration of another embodiment of a switchable impedance transformation network in which several capacitors are placed along the inductor.

FIG. 8 is an illustration of another embodiment of a switchable impedance transformation network 244 in which several capacitors 303a, 303b . . . 303n are placed along the inductor 301. Each of the capacitances and location of each of the capacitors is selected to provide a transformation from 50 Ohms at the external terminal to 25 Ohms at the internal terminal for a particular frequency. In some embodiments, combinations of switches 703 can be closed to provide a proper impedance match at the desired frequency. Alternatively, only one switch 703 is closed at a time and the capacitance of each capacitor 303 is selected to provide a proper match at one associate frequency.

It should be noted that providing the impedance transformation networks disclosed above increases the amount of AC current that the transmit/receive switch must handle for the same power level. That is, while reducing the AC voltage, a commensurate increase in AC current is necessary to maintain the same power. Therefore, the switch needs to be designed with to handle the increase in current. That might include taking into account the electromigration of metals, thermal management, etc. In addition, the impedance transformation networks will contribute some loss to the overall system. Tradeoffs may be necessary to balance the loss of each impedance transformation network with the desired bandwidth (i.e., selecting the Q of the components of the impedance transformation network). As noted above, in some embodiments in which it is desirable to reduce the amount of current flowing through the switch network and advantages of doing so offset any disadvantage due to increasing the voltage swing at the terminals of the switch network, the external impedance may be smaller than the internal impedance.

Fabrication Technologies and Options

The term "FET" means any transistor that has a gate whose voltage determines the conductivity of the transistor. Various embodiments can be implemented to meet a wide variety of specifications. Unless otherwise noted above, selection of suitable component values is a matter of design choice. Various embodiments may be implemented in any suitable IC technology (including but not limited to FET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS) bipolar, GaAs HBT, GaN HEMT, GaAs pHEMT, and MESFET technologies.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents.

It is to be understood that the foregoing description is intended to illustrate, and not to limit, the scope of the claimed invention. Accordingly, other embodiments are within the scope of the claims. Note that paragraph designations within claims are provided to make it easier to refer to such elements at other points in that or other claims. They do not, in themselves, indicate a particular required order to the elements. Further, such designations may be reused in other claims (including dependent claims) without creating a conflicting sequence.

What is claimed is:

1. A switch network comprising:
   (a) at least one switch control input;
   (b) a first impedance transformation network having an external terminal and an internal terminal, the external terminal of the first impedance transformation network presenting a first relatively high impedance and the internal terminal of the first impedance transformation network presenting a second relatively low impedance;

(c) a second impedance transformation network having an external terminal and an internal terminal, the external terminal of the second impedance transformation network presenting a third relatively high impedance and the internal terminal of the second impedance transformation network presenting a fourth relatively low impedance;

(d) a third impedance transformation network having an external terminal and an internal terminal, the external terminal of the third impedance transformation network presenting a fifth relatively high impedance and the internal terminal of the third impedance transformation network presenting a sixth relatively low impedance;

(e) a first through switch having a first and second signal terminal and having a control terminal, the first signal terminal coupled to the internal terminal of the first impedance transformation network, the second signal terminal coupled to the internal terminal of the second impedance transformation network and the control terminal coupled to at least a first switch control input;

(f) a second through switch having a first and second signal terminal and having a control terminal, the first signal terminal of the second through switch being coupled to the first signal terminal of the first through switch, the second signal terminal of the second through switch being coupled to the internal terminal of the third impedance transformation network and the control terminal of the second through switch being coupled to at least a second switch control input.

2. The switch network of claim 1, further comprising;

(a) a first shunt switch having a first and second signal terminal and having a control terminal, the first signal terminal of the first shunt switch being coupled to the second signal terminal of the first through switch, the second signal terminal of the first shunt switch being coupled to a first reference terminal and the control terminal being coupled to the at least one switch control input; and (b) a second shunt switch having a first and second signal terminal and having a control terminal, the first signal terminal of the second shunt switch being coupled to the second signal terminal of the second through switch, the second signal terminal of the second shunt switch coupled to a second reference terminal and the control terminal of the second shunt switch coupled to the at least one switch control input.

3. The switch network of claim 2, wherein the first and second reference terminals are coupled to an internal reference potential.

4. The switch network of claim 3, wherein the reference potential is ground.

5. The switch network of claim 1, wherein the first, third and fifth relatively high impedance are approximately the same impedance and wherein the second, fourth and sixth relatively low impedance are approximately the same impedance.

6. The switch network of claim 5, wherein the first relatively high impedance is approximately 50 Ohms and the first relatively low impedance is approximately 25 Ohms.

7. The switch network of claim 1, wherein the first through switch, second through switch, first shunt switch and second shunt switch are each implemented as field effect transistors (FETs).

8. The switch network of claim 7, wherein the first signal terminals are each a drain of a FET, the second signal terminals are each a source of a FET and the control terminals are each a gate of a FET.

9. The switch network of claim 8, wherein at least one of the FETs are implemented as a stacked FET.

10. The switch network of claim 1, further comprising a circulator used within a transceiver, the circulator having a first port, a second port and a third port, the first port coupled to the external terminal of the first impedance transformation network, the second port configured to be coupled to a transmit amplifier and the third port configured to be coupled to an antenna, wherein there is a low impedance path through the circulator from the first port to a second port, there is a low impedance from the second port to a third port 124, and a low impedance from the third port 124 to the first port 104 and there is a relatively high impedance from the first port 104 to the third port 124, a relatively high impedance from the third port to the second port and a relatively high impedance from the second port to the first port.

* * * * *